United States Patent [19]

Perraud

[11] Patent Number: 5,444,409
[45] Date of Patent: Aug. 22, 1995

[54] INTERFACE CIRCUIT FOR LINKING MICROPROCESSORS

[75] Inventor: Jean-Claude Perraud, St. aubin S/Mer, France

[73] Assignee: U.S. Philips Corporation, New York, N.Y.

[21] Appl. No.: 74,088

[22] Filed: Jun. 9, 1993

[30] Foreign Application Priority Data

Jun. 10, 1992 [FR] France ................. 92 06985

[51] Int. Cl.$^6$ ............................................. H03K 5/08
[52] U.S. Cl. ................................. 327/315; 327/319; 327/322
[58] Field of Search ................ 307/475, 542, 546–547, 307/267; 327/312, 315, 319, 322

[56] References Cited

U.S. PATENT DOCUMENTS

| | | | |
|---|---|---|---|
| 4,567,537 | 1/1986 | Kalkhof et al. | 361/18 |
| 4,656,565 | 9/1990 | Bahlmann | 307/254 |
| 5,146,116 | 9/1992 | Sugimoto | 307/475 |

FOREIGN PATENT DOCUMENTS 0281684 9/1988 European Pat. Off. ...... H03K 17/18
0339736 11/1989 European Pat. Off. .
8304351 12/1983 WIPO .................. H03K 5/08

Primary Examiner—Margaret Rose Wambach
Attorney, Agent, or Firm—Steven R. Biren

[57] ABSTRACT

An interface circuit for linking microprocessors, intended to limit the current (Iout) in the link (L1–L2) by inserting in the link the emitter-collector path of a first transistor ($T_1$) which is in the saturated state during operation. This circuit includes a second transistor ($T_2$) which has a geometry k times smaller than that of the first transistor ($T_1$) and which is coupled to the first transistor ($T_1$) so as to produce a copy (Iy) of the link current (Iout), and a base current generator (10) which produces an output current (Iz) which feeds the bases of the first and the second transistor ($T_1$, $T_2$), and which is a regressive function of the copy current (Iy), on the basis of a fixed reference current ($I_0$). A pair of transistors ($T_3$, $T_4$), similar to the first and the second transistor ($T_1$, $T_2$) but connected to the link (L1–L2) in an inverted manner, provides protection for bidirectional operation. The interface circuit can be used for temporary links between different microprocessors, for example in chip cards.

6 Claims, 3 Drawing Sheets

INTERFACE CIRCUIT FOR LINKING MICROPROCESSORS

BACKGROUND OF THE INVENTION

The present invention relates to an interface circuit for linking microprocessors by a link, which circuit ensures that the current of the link does not exceed a limit value by inserting in said link the emitter-collector path of a first transistor.

Notably in a system for reading a chip card a given number of links are established between the microprocessor on the card and the microprocessor of the card reader. Among these links, those of the "input/output" type serve to exchange data between the two microprocessors. During normal operation of the system, one of the two microprocessors transmits signals with low impedance which are received by the other microprocessor with a comparatively high impedance and the current pulses corresponding to this information remain small and, generally speaking, do not exceed a value of 2 mA.

However, it may still be that faulty operation of the system results in the two microprocessors tending to impose, with low impedance and simultaneously, opposite logic states. An excessive current then occurs in the link to the extent that one of the microprocessors is destroyed by an excessive current. The same occurs in the event of an accidental short circuit between the link and one of the power supply terminals. Notably in the case of a microchip card reading system, the microprocessor provided on the card cannot tolerate an output current in excess of approximately 10 mA. A particularly disturbing situation is that which may occur when a microchip card reader is faulty and all users presenting their card to this reader successively destroy their own card because of this fault.

The invention thus relates to an interface circuit which is intended to limit the current flowing in the link between two microprocessors so as to avoid the destruction of one of the microprocessors, and which preferably supplies a signal announcing the faulty state of the system and enabling the interruption of any other operation taking place via the link.

Generally speaking, it is known that the emitter-collector path of a transistor inserted in a link as a ballast is actually the same as the introduction of a voltage drop in said link, when the current flowing in the link exceeds a fixed limit value, under the control of a predetermined base current.

A connection in which a transistor is inserted as a ballast for feeding a load is known notably from U.S. Pat. No. 4,956,565. However, this document offers a solution to a technical problem which deviates substantially from that envisaged by the present invention.

SUMMARY OF THE INVENTION

The invention thus has for its object to propose an interface circuit for linking microprocessors which offers an effective protection in the case of an excessive current in the link.

An interface circuit of this kind in accordance with the invention is characterized in that it comprises a second transistor of the same polarity and having a geometry which is k times smaller than that of the first transistor, its emitter and base being connected to the emitter and the base, respectively, of the first transistor, and also comprises a base current generator, an input of which receives the collector current Iy of the second transistor and an output of which supplies a current Iz which feeds the bases of the first and the second transistor, said current Iz being equal to a reference current Wherefrom there is subtracted a current deduced from the current Iy in conformity with a rule such that beyond the limit value of the current in the link, the first transistor leaves the saturated state which it normally has, thus imposing a voltage drop in the link.

When the current flowing in the link is normal, the first transistor is in the highly saturated state, thus imposing a voltage drop in said link which is negligibly small in practice. Instead of feeding the bases of the first and the second transistor together with a fixed current, according to the invention the current Iz supplied by the base current generator, decreases when the current measured by the second transistor increases so that the change of state of the first transistor is more pronounced and more exact.

In a first embodiment of the invention, the interface circuit is characterized in that the base current generator comprises a current source which serves to generate the reference current, a first current mirror, an output of which forms the output of the generator supplying the current Iz, and a second current mirror, an input of which constitutes the input of the generator, receiving the current Iy, and an output of which supplies a current which is subtracted from the reference current, said current difference being applied to the input of the first current mirror.

The base current generator is controlled by a current and supplies a current difference by means of current mirrors so that it can be rendered substantially insensitive to temperature. According to this first embodiment, for simplification use can be made of first and second current mirrors having input/output current ratios equal to 1. The interface circuit operates in a stable state, maintaining a limit current in the link by imposing a voltage drop in the first transistor, switched out of saturation, in the case of an anomaly.

In an alternative version of this embodiment, the first and the second current mirror may have multiplying factors m and n for their output current with respect to their input current. According to this version, the limit value of the current of the link can be rendered less dependent on the value of the current gain of the first and the second transistor.

A second embodiment of the interface circuit in accordance with the invention is characterized in that the first current mirror comprises a supplementary output which supplies a current which is subject to a multiplying factor p with respect to its input current, and in that said supplementary output is connected to the input of the second current mirror so that the second current mirror outputs a current only for as long as the collector current Iy of the second transistor remains smaller than the current $I_o$ supplied by the supplementary output of the first current mirror. In this embodiment, the supply current Iz for the bases of the first and the second transistors remains fixed and has a value equal to $m.I_o$ for as long as the current in the link does not exceed a current threshold which can be determined. Beyond this current threshold, the supply current Iz for the bases of the first and second transistor decreases. When the multiplying coefficients m, n and p are appropriately chosen, this decrease is of the positive reaction type and takes place quickly in order to set the first transistor to a state of low conductivity. The current in the link is then stabilized to a value which amounts to only a fraction of the threshold current which was previously exceeded. This embodiment of the invention thus offers a supplementary protection in the case of an excessive current in the link.

In most cases, the link between microprocessors carries reversible signals, that is to say signals originating from either one of these microprocessors. In this case the interface circuit in accordance with the invention can also be used in an embodiment in which the constituent elements are essentially doubled and which is characterized in that with the first transistor there is associated a third transistor which has the same polarity and whose collector is connected to the emitter of the first transistor, its emitter being connected to the collector of the first transistor, in that a fourth transistor which has the same polarity and a surface area which is k times smaller than that of the third transistor is associated with the third transistor, the bases and emitters of the third and the fourth transistor being interconnected, and in that the base current generator receives, on an additional input, the collector current I'y of the fourth transistor and supplies, via an additional output, a current Iz' which feeds the bases of the third and the fourth transistor and whose variation rule with respect to Iy' and $I_o$ is identical to the variation rule of the current Iz with respect to the current Iy.

The specific embodiments of the invention for a bidirectional link can be deduced from the already-described embodiments for a unidirectional link.

BRIEF DESCRIPTION OF THE DRAWING

Other details and advantages of the invention will become apparent from the following description which is given with reference to the attached drawings, which relate to nonlimitative examples; therein.

DESCRIPTION OF PREFERRED EMBODIMENTS

Figure 1:
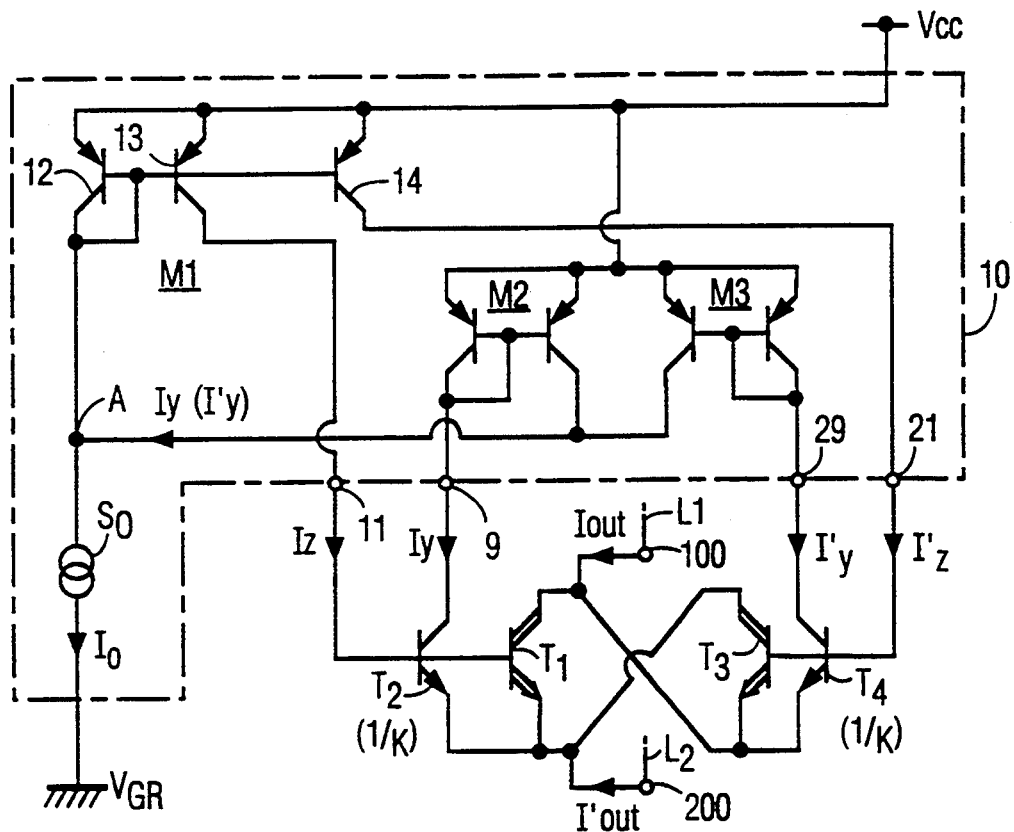
FIG. 1 shows a circuit diagram of a first embodiment of the interface circuit in accordance with the invention.

FIG. 1 shows a link L1–L2 which is interrupted between the terminals 100 and 200, the emitter-collector path of a first transistor $T_1$ being inserted between these terminals. It is assumed first of all that the current of the link Iout flows from the terminal 100 to the terminal 200. A second transistor $T_2$, having the same polarity as the first transistor $T_1$ and a geometry which is k times smaller than that of the transistor $T_1$, has its emitter and base connected to the emitter and the base, respectively, of the transistor $T_1$. The collector current of the second transistor $T_2$ is denoted as Iy and this collector is connected to an input terminal 9 of a base current generator 10 which supplies, via an output terminal 11, a current Iz which feeds the bases of the first and the second transistor $T_1$ and $T_2$. A line current value Imax has been chosen beyond which the operation of the system is considered to be abnormal and the interface circuit should introduce a suitable impedance to prevent destruction of the microprocessors. Below the link current Imax, however, the state of the system is considered to be normal and the first transistor $T_1$ is provided to operate in the saturated state, the current Iz on the output 11 of the base current generator 10 being sufficiently high. In the example shown in FIG. 1, the current Iz is equal to a fixed current $I_o$, supplied by a current source $S_o$, wherefrom there is subtracted a value equal to the current Iy supplied by the collector of the transistor $T_2$. In order to realize this function, the current source $S_o$ is connected between a reference voltage $V_{GR}$ and a supply source $V_{cc}$, the link between the current source $S_o$ and the supply voltage $V_{cc}$ comprising a first current mirror M1, referenced to the supply voltage $V_{cc}$ and formed by the input transistor 12 and the output transistor 13, the transistor 12 being connected as a diode. The base current generator 10 also comprises a second current mirror M2 which is also referenced to the supply voltage $V_{cc}$, is controlled at the input by the current Iy from the terminal 9, and outputs substantially the same current Iy to a junction A between the input of the first current mirror M1 and the current source $S_o$. Thus, the first current mirror M1 is controlled by a current having a value equal to $I_o$−Iy and outputs a substantially identical current Iz=$i_o$−Iy via the output terminal 11.

Figure 2:
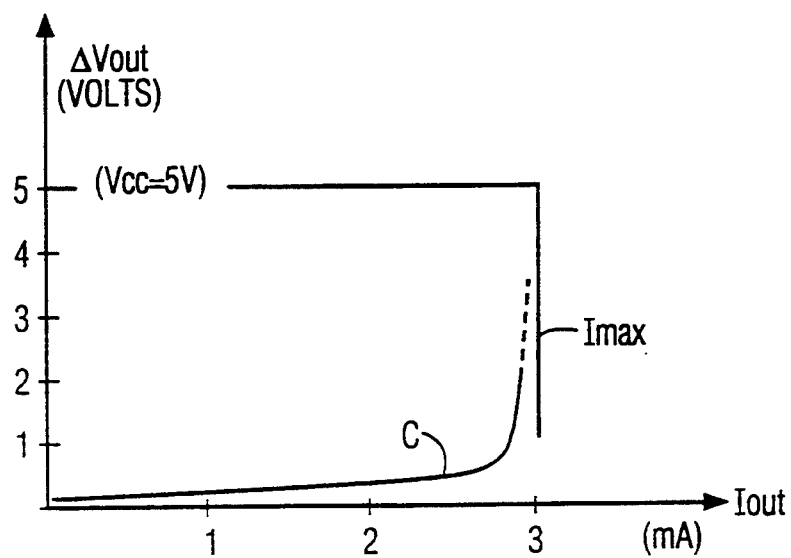
FIG. 2 shows a diagram illustrating its operation.

FIG. 2 illustrates the variation of the voltage drop between the terminals 100 and 200 as a function of the link current Iout. When the link current Iout is small, the first transistor $T_1$ is in the saturated state whereas the second transistor $T_2$ is not in the saturated state and, therefore, supplies a current Iy which is larger (for example, more than two times larger) than the current value Iout/k, the parameter k being equal to the ratio of the surfaces of the transistor $T_1$ and the transistor $T_2$. When the link current Iout increases, the current Iz decreases so that the saturated state of the first transistor $T_1$ progressively diminishes and, in correlation, the ratio of the current Iy to the current Iout progressively approaches the value of the ratio 1/k. This ratio is reached substantially when the first transistor $T_1$ leaves the saturated state. The following calculation enables determination of an approximate value of the link current Imax which may not be exceeded in the link, taking into account exclusively the elements of the circuit of FIG. 1 which have been described thus far.

$$Iy = Imax/k$$

$$I_z = I_o - Imax/k \qquad (1)$$

Assuming that the current gain of the transistors $T_1$ and $T_2$ is identical and equal to $\beta$, the current $I_z$ corresponds to the supply for the bases of $T_1$ and $T_2$, so that:

$$I_z = Imax/\beta + Imax/k.\beta \qquad (2)$$

By combining the relations (1) and (2), it follows that:

$$Imax = k.I_o(1 + k/\beta + 1/\beta) \qquad (3)$$

For example, using $I_o = 150$ μA and k=24:
Imax=2.4 mA for $\beta=50$
=2.88 mA for $\beta=100$, and
=3.2 mA for $\beta=200$.

The curve C of FIG. 2 represents a practical example of the variation of ΔVout (voltage drop between the terminals 100 and 200) as a function of the link current Iout in the case where the second transistor $T_2$ is constructed to be 24 times smaller than the transistor $T_1$. A suitable protection is thus provided if it is ensured that the nominal current in the link does not exceed 2 mA.

The description given thus far concerns an interface circuit of the unidirectional type, that is to say a circuit for which Iout flows in the direction from the terminal 100 to the terminal 200. In practice, the link to be protected is often of a bidirectional type. FIG. 1 shows the elements which are to be added in order to obtain a bidirectional interface circuit. With the first transistor $T_1$ there is associated a third transistor $T_3$ which has the same polarity as the transistor $T_1$, its collector being connected to the emitter of the transistor $T_1$ and its emitter being connected to the collector of the transistor $T_1$ (inverted connection of the emitter-collector paths). Similarly, a fourth transistor $T_4$ of the same polarity is associated with the third transistor $T_3$, the bases and the emitters of the third and the fourth transistor $T_3$, $T_4$ being connected to one another, the transistor $T_4$ having a geometry which is k times smaller than that of the transistor $T_3$. In order to ensure symmetry of operation, the transistors $T_1$ and $T_3$ have an identical geometry and structure. The base current generator 10 receives, on an additional input 29, the collector current Iy' of the fourth transistor $T_4$, and supplies, via an additional output terminal 21, a base supply current Iz' which feeds the bases of the transistors $T_3$ and $T_4$. In order to ensure the same variation rule for Iz' with respect to Iy' and $I_o$, the first current mirror M1 comprises an additional transistor 14 whose collector supplies a current Iz' which is equal to $I_o$—Iy' because of the fact that a third current mirror M3 receives the current I'y on its input and applies a copy of this current to the junction A. The additional part of the circuit described above behaves in the same way as its previously described symmetrical part, so that it performs the same characteristic function for a link current I"out flowing in the direction from the terminal 200 to the terminal 100.

The above explanations, given for half the circuit of FIG. 1 for a unidirectional circuit, remain valid because when in the case of the bidirectional circuit one of the transistor pairs $T_1$, $T_2$ or $T_3$, $T_4$ is connected so as to operate in the reverse manner because the current flows in the direction from the emitter to the collector. The current transferred via the emitter-collector path of these transistors remains small so that its effect may be ignored in relation to the operation of the transistor pair operating in the forward direction.

It is to be noted that the current mirrors M1, M2 and M3 may be chosen so that the ratio of the output current to the input current deviates from 1.

A multiplying factor m is then defined for the current mirror M1 (identical for its two outputs) and a multiplying factor n is defined for the current minor M2 (and for the current mirror M3). A calculation which is analogous to that given with reference to FIG. 1 reveals that the relation (3), enabling determination of the limit current Imax, then becomes:

$$Imax = k \cdot I_0 / \left( n + \frac{k+1}{\beta \cdot m} \right) \quad (4)$$

It appears that the influence of the current gain $\beta$ on the value of Imax can be minimized by choosing m and/or n to be greater than unity.

Figure 3:
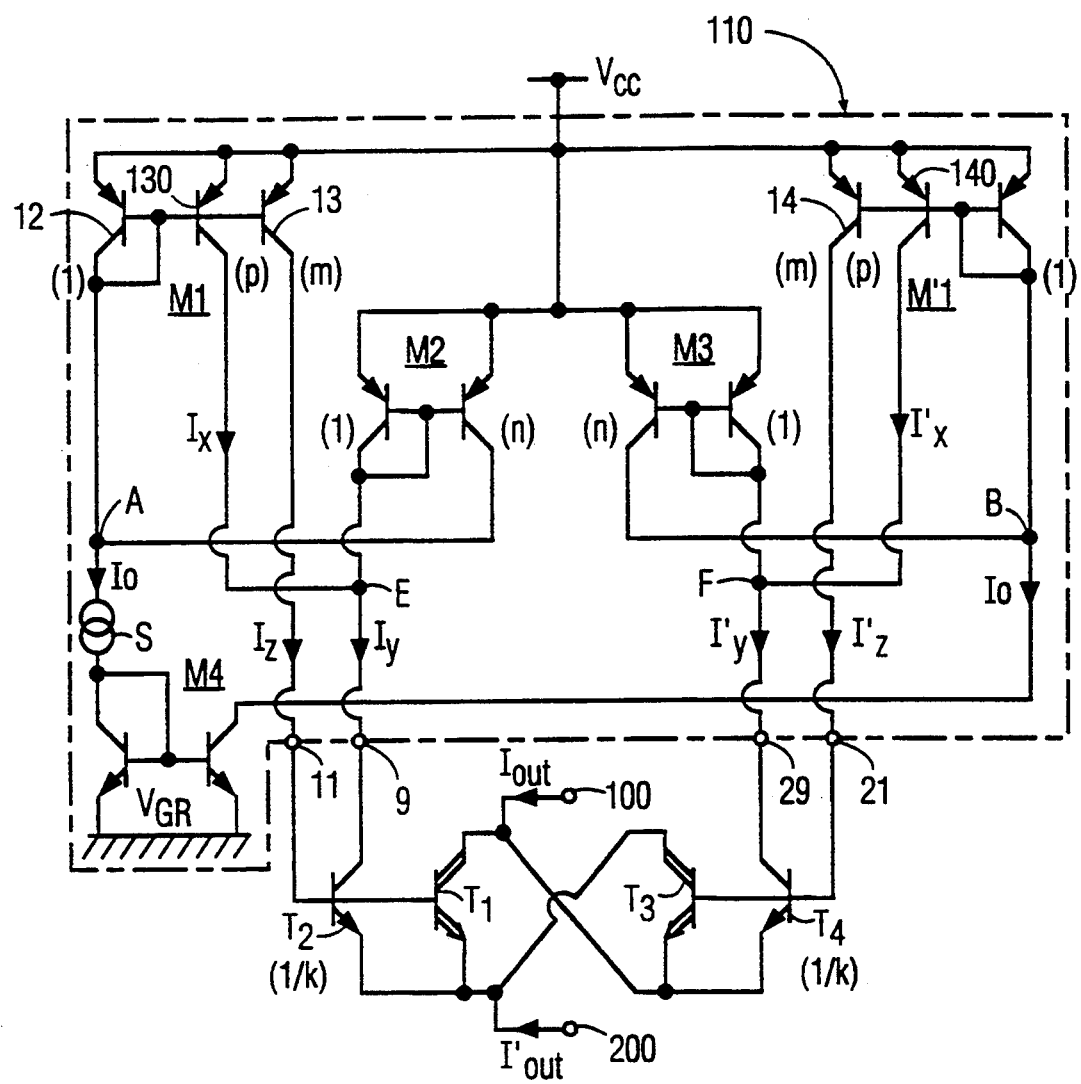
FIG. 3 shows the diagram of a second embodiment of the invention.

For example, using $I_o = 250$ μA, k=28 and m=n=2:
Imax=3.05 mA for $\beta=50$
=3.26 mA for $\beta 100$
=3.38 mA for $\beta=200$ FIG. 3 shows the diagram of a second embodiment of an interface circuit in accordance with the invention. In this Figure, the elements having the same function as in FIG. 1 are denoted by the same references. In the present embodiment, the connection of the transistors $T_1$, $T_2$, $T_3$, $T_4$ between the terminals 100 and 200 of the link between the microprocessors is identical to that of FIG. 1. The base current generator 110 itself exhibits differences, notably as regards the variation rule between the current Iz, (I'z) for feeding the bases of the first and the second transistor $T_1$, $T_2$ (third and fourth transistor $T_3$, $T_4$) with respect to the collector current Iy (Iy') of the transistors $T_2$ ($T_4$). In the base current generator 110 a current source S applies a current $I_o$ to the input of a first current mirror M1, the same current $I_o$ being copied by a current mirror M4 which is referenced to the reference voltage $V_{GR}$ and applied to the control input of a further current mirror M'1 whose function in relation to the transistors $T_3$ and $T_4$ is very similar to that of the first mirror M1 in relation to the transistors $T_1$ and $T_2$. Besides the transistor 13, the first current mirror M1 comprises an additional transistor 130 whose collector constitutes a supplementary output of this current mirror. The geometries of the transistors 13 and 130 relative to the control transistor 12 are chosen so that the output currents are subject to multiplying factors m and p, respectively, with respect to the current at the control input of the first mirror. A similar configuration is imparted to the other current mirror M'1 in which a supplementary transistor 140 constitutes, via its collector, a supplementary output with the multiplying factor p, whereas the output transistor 14 constitutes, by way of its collector, an output with a multiplying factor m with respect to the input current. The collector of the transistor 130 is connected to a junction E between the terminal 9 and the input of the second current mirror M2, whereas the collector of the transistor 140 is similarly connected to a junction F between the terminal 29 and the input of the third current mirror M3. The second current mirror M2 receives at its input a current which is equal to the difference (Iy−Ix), when this difference is positive, and outputs a current subject to a multiplying factor n which is applied to the junction A between the current source S and the input of the first current mirror M1. Similarly, the input of the third current mirror M3 receives a current equal to the difference (Iy'−Ix'), when this difference is positive, and outputs a current which is subject to a multiplying factor n which is applied to a junction B, similar to the junction A, but relative to the input of the other current mirror M'1.

Figure 4:
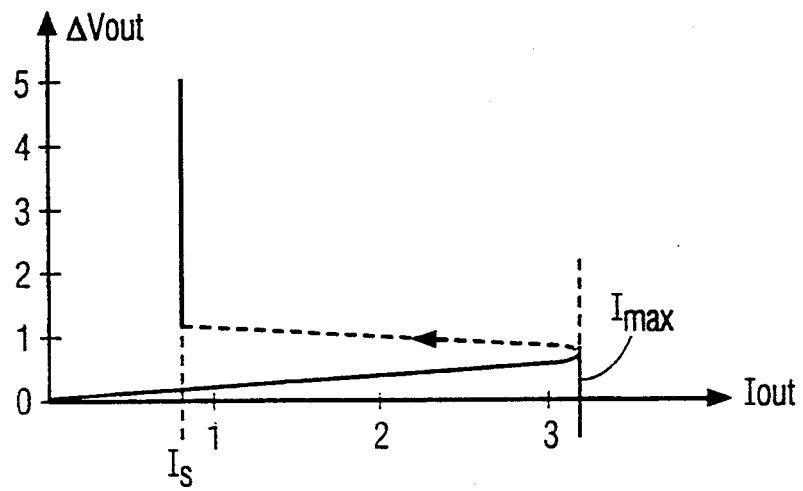
FIG. 4 shows a diagram illustrating its operation.

The operation of the circuit is explained with reference to FIG. 4 which shows the voltage drop ΔVout as a function of the current Iout in the link which is considered to flow in the direction from the terminal 100 to the terminal 200. This operation is based on the fact that for as long as the current Iout of the link remains sufficiently small (within the limits of normal operation), the current Iy of the collector of the transistor $T_2$ is smaller than the current $I_x = pI_o$ supplied by the collector of the transistor 130, so that the second current M2 does not output a current.

When Iout increases, the current difference $pI_o - Iy$ decreases. A limit value Imax of the link current Iout is reached when the difference $(pI_o - Iy)$ changes it sign and when the second current mirror M2 starts to output a current. The output current of this mirror M2 is applied to the junction A so as to be subtracted from the current $I_o$ and the first current mirror M1 then receives at its input a current which decreases with respect to the foregoing situation. When the multiplying factors m, n and p are suitably chosen, it will appear that the circuit of FIG. 3 is susceptible to enter a reactive state and be stabilized to a value $I_s$ of the link current Iout which is only a fraction of the limit current Imax.

When Imax is reached, the difference $(pI_o - Iy)$ is negative and very small; an approximate value of Imax is then:

$$Imax \approx k.p.I_o$$

supposing that the transistors $T_1$ and $T_2$ have the same current gain. In practice, the value of Imax thus determined appears to be an excessive approximted value because it would be necessary to use a value of k which is smaller than the geometrical ratio of the transistors $T_1$ and $T_2$ in order to take into account the saturated state of the transistor $T_1$.

The stabilization current $I_s$ will now be determined.

When Ix is the current output by the transistor 130, $$Iz = (m/p).Ix$$

so $$Iy = \beta.Iz/(k+1)$$

so that:

$$Iy = \frac{m}{p} \beta \frac{Ix}{(k+1)} \quad (5)$$

On the other hand, the current Ix may be determined while taking into account the second current mirror M2:

$$Ix/p = I_o - n(Iy - Ix) \quad (6)$$

By combining the relations (5) and (6) and by utilizing $I_s = k.Iy$, because the transistors $T_1$ and $T_2$ are out of saturation, there is obtained:

$$I_s = k \cdot p \cdot I_0 / \left[ p \cdot n - \frac{p}{m \cdot \beta} \cdot (K+1)(p \cdot n - 1) \right] \quad (7)$$

Because $k.pI_o = Imax$, it appears that $I_s$ is susceptible to be smaller than Imax for given values of the parameters k, m, n and p. However, the influence of the current gain $\beta$ is less marked, when m is chosen to be greater than p.

When all factors m, n and p are taken so as to be equal to 1, $I_s = $ Imax is obtained.

The following Table provides some numerical examples obtained by means of the relation (7) for $I_o = 50$ μA, k=24 and hence Imax = 3.6 mA.

| | |
|---|---|
| For m = 2, n = 3 and p = 3 | $I_S$ = 1.20 for $\beta$ = 50 |
| | = 0.60 for $\beta$ 100 |
| | = 0.48 for $\beta$ 200 |
| For m = 3, n = 3 and p = 1 | $I_S$ = 1.35 for $\beta$ = 50 |
| | = 1.27 for $\beta$ = 100 |
| | = 1.23 for $\beta$ = 200. |

The foregoing determination is an approximative type and has been realized by taking into account only one half of the circuit of FIG. 3. As has already been stated with reference to the diagram of FIG. 1, the addition of the complementary half of the circuit in order to render it bidirectional has only a minor effect on the phenomena involved, so that the results obtained by means of the complete circuit of FIG. 3 remain approximately the same.

The presence of the current mirrors M1 and M1' provides, in the described example, independent control of the transistors $T_1$ and $T_3$ as a function of the direction of the link current Iout.

It is to be noted that embodiments of the base current generator other than those described in the foregoing examples will be evident to those skilled in the art. A similar result will be obtained when the current Iz supplied by the base current generator is a regressive function of the current Iy applied to the input of this generator on the basis of a fixed reference current $I_o$. In order to avoid undue current consumption in the interface circuit in accordance with the invention, it is advantageous to choose a surface ratio of the transistors $T_1/T_2$ and $T_3/T_4$, that is to say a factor k, which is comparatively high, i.e. in the order of from 20 to 30. Thus, except for the transistors $T_1$ and $T_3$, all transistors of the circuit may be chosen so as to have the minimum dimension according to the technology used.

It is to be noted that, although the described examples utilize npn-type transistors $T_1$, $T_2$, $T_3$ and $T_4$, the invention is also effective for the case where all transistors are of the opposite type, the supply voltage for the circuit then being inverted.

Figure 5:
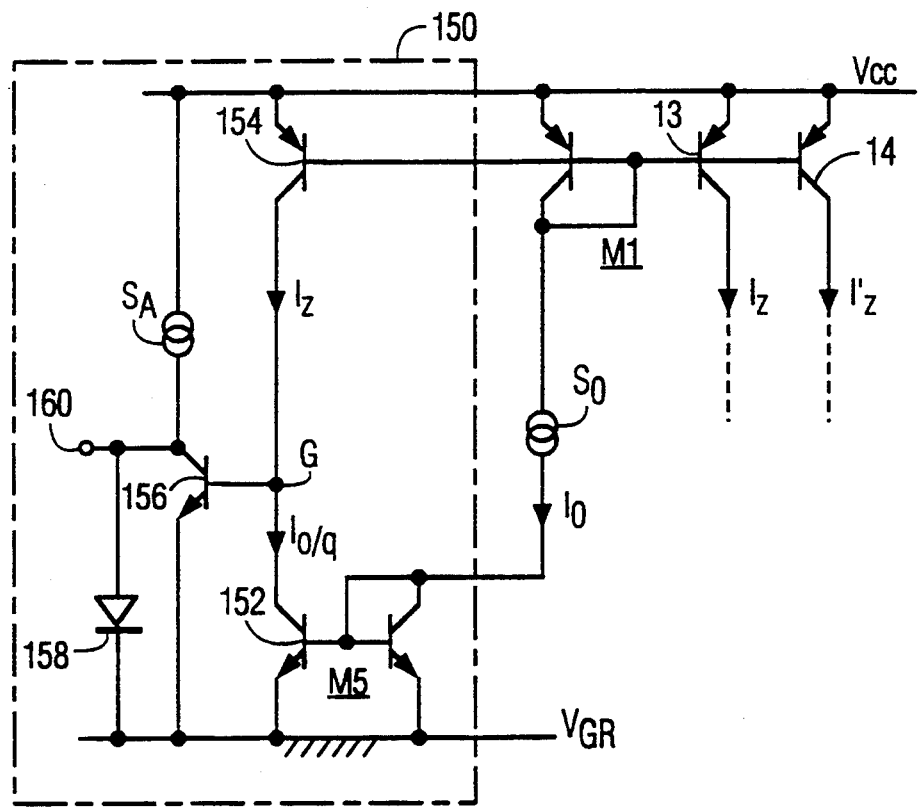
FIG. 5 shows the diagram of an embodiment of an alarm signal generator circuit which may be connected to the circuit shown in FIG. 1.

FIG. 5 shows an embodiment of an alarm signal generator 150 which detects the saturated state of the transistors $T_1$ and $T_3$ of the circuit shown in FIG. 1. FIG. 5 shows only the first current mirror M1 and the reference current source So. The current source So is now connected to the input of a current mirror M5, referenced to the reference voltage $V_{GR}$. The output of the current mirror M5 is formed by a transistor 152 which is proportioned so that it reproduces a fraction 1/q of the input current $I_o$, the factor q being greater than 1 and being determined in a manner to be described hereinafter. The first current mirror M1 comprises an annexed output which is formed by the collector of a transistor 154 which outputs a copy of the current Iz (or I'z as the case may be) on a junction G whereto the collector of the transistor 152 is also connected. The junction G thus receives the difference between the currents Iz and $I_o/q$. It is connected to the base of a transistor 156 whose emitter is connected to the voltage $V_{GR}$ and whose collector is fed, on the basis of the voltage $V_{cc}$, by a current source $S_A$, and also connected to the voltage $V_{GR}$ via a junction 158 in the forward direction. Finally, to the collector of the transistor 156 there is connected an output terminal 160 for the alarm signal which is significative of an excessive current in the link when it is high.

Figure 6:
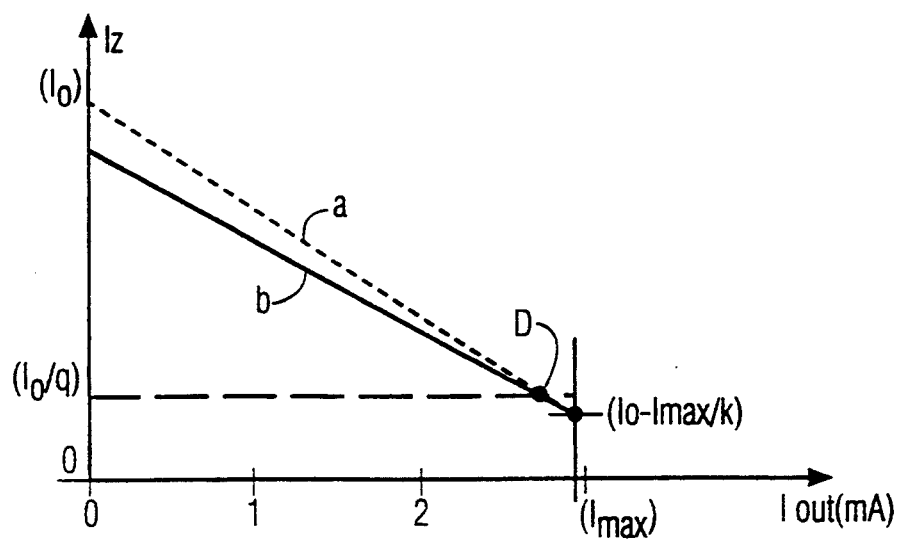
FIG. 6 shows a diagram illustrating its operation.

The operation of the alarm signal generator 150 will now be described with reference to the diagram of FIG. 6 which shows an example of the variation of the current Iz (feeding the bases of the transistors $T_1$ and $T_2$) as a function of the current Iout in the link. For a current Iout which is zero, the current Iz will be equal to $I_o$ if the transistor $T_1$ is not in the saturated state, whereas for a link current equal to Imax, Iz becomes substantially equal to $I_o$ −Imax/k, because the transistor $T_1$ is then no longer saturated. The straight line denoted by the reference a represents the linear variation corresponding to the expression $I_o$ −Iout/k.

However, the curve b, corresponding to a very detailed determination of the current Iz, moves only slightly away from the line it because of the more or less pronounced saturation of the transistor $T_1$, and it moves away even less when the current Imax is approached. A value of $I_o/q$ (and hence a factor q) is fixed so that the value $I_o/q$ intercepts the curve b for a current Iout which is slightly smaller than Imax but still greater than the link current corresponding to normal operation. The point D on the curve b corresponds to the change of sign of the current difference $I_z − I_o/q$. It follows that for a normal link current the transistor 156 is conductive and produces a logic state 0 on the output terminal 160, whereas for an abnormally large link current, the transistor 156 is blocked. A logic 1 signal is then supplied on the output terminal 160, which signal may be used in a suitable manner by one of the microprocessors so as to interrupt the dam exchange process, for example by utilizing a non-maskable interrupt for the relevant microprocessor.

Referring to the interface circuit described with reference to FIG. 3, the generation of an alarm signal on the basis of the same principle as shown in FIG. 5 can be readily carried out. It is to be noted, however, that because of the use of the two current mirrors M1 and M'1 it is useful to provide two signal generators of the type 150 of FIG. 5, their outputs, such as 160, being applied to two inputs of an OR-gate which then outputs an alarm signal which is independent of the direction of the current Iout in the link.

Moreover, when operation is to take place in the positive reaction conditions of the circuit of FIG. 3, procuring a stabilization current $I_s$ which is smaller than the current Imax, the current Iz will have only two possible values which are distinct from one another. It is easy to choose the fixed current, proportional to $I_o$, which is between these two values and which triggers an alarm signal as soon as the link current is fried at its security level $I_s$. It is also possible to produce an alarm signal in a very simple manner in positive reaction conditions of the circuit of FIG. 3 by deducing this signal from the current mirrors M2 and M3, one of which outputs a current only in the presence of an anomaly, indicating that the link current has exceeded the relevant nominal value.

I claim:

1. An interface circuit for linking microprocessors by a link, which circuit ensures that the current of the link does not exceed a limit value by inserting in said link the emitter-collector path of a first transistor, characterized in that it comprises a second transistor of the same polarity and having a geometry which is k times smaller than that of the first transistor, its emitter and base being connected to an emitter and a base, respectively, of the first transistor, and also comprises a base current generator, an input of which receives a collector current Iy of the second transistor and an output of which supplies a current Iz which feeds the bases of the first and the second transistor, said current Iz being equal to a reference current from which there is subtracted a current deduced from the current Iy such that beyond the limit value of the current in the link, the first transistor leaves a saturated state which it normally has, thus imposing a voltage drop in the link further characterized in that the base current generator comprises a current source which serves to generate the reference current, a first current mirror, an output of which forms the output of the generator supplying the current $I_z$ , and a second current mirror, an input of which constitutes the input of the generator, receiving the current Iy, and an output of which supplies a current which is subtracted from the reference current, said current difference being applied to the input of the first current mirror, the first and the second current mirror have multiplying factors m and n, respectively, for their output current with respect to their input current and the first current mirror comprises a supplementary output which supplies a current which is multiplied by a multiplying factor p with respect to its input current, and in the said supplementary output is connected to the input of the second current mirror so that the second current mirror outputs a current only for as long as the collector current Iy of the second transistor remains smaller than the current $I_o$ supplied by the supplementary output of the first current mirror.

2. An interface circuit as claimed in claim 1, characterized in that the multiplying factors m, n and p are chosen so that the circuit is stabilized, by way of positive reaction, to a value $I_s$ of the link current which is smaller than a limit Imax of the link current when the latter is reached.

3. An interface circuit as claimed in claim 1, characterized in that with the first transistor there is associated a third transistor which has the same polarity and whose collector is connected to the emitter of the first transistor, its emitter being connected to the collector of the first transistor, in that a fourth transistor which has the same polarity and a geometry which is k times smaller than that of the third transistor is associated with the third transistor, the bases and emitters of the third and the fourth transistor being interconnected, and in that base current generator receives, on an additional input, a collector current Iy' of the fourth transistor and supplies, via an additional output, a current Iz' which feeds the bases of the third and the fourth transistor and whose variation with respect to Iy' and $I_o$ is identical to the variation of the current Iz with respect to the currents Iy and $I_o$, and is realized by way of means, comprising a third current minor whose input constitutes said additional input of the base current generator.

4. An interface circuit as claimed in claim 3, characterized in that the output of the third current mirror is connected to the input of the first current mirror, and in that the first current mirror comprises an additional output supplying the current I'z.

5. An interface circuit as claimed in claim 3, characterized in that with the first current mirror there is associated a further, current mirror which comprises one input and two outputs for feeding the bases of the third and fourth transistor.

6. An interface circuit as claimed in claim 1, characterized in that it also comprises an alarm signal generator provided which means utilizing the sign of a difference between a current proportional to the supply current for the bases Iz and I'z and a given fixed current.

* * * * *